US009214546B2

(12) United States Patent
Hayashi et al.

(10) Patent No.: US 9,214,546 B2
(45) Date of Patent: Dec. 15, 2015

(54) SILICON CARBIDE SWITCHING DEVICE WITH NOVEL OVERVOLTAGE DETECTION ELEMENT FOR OVERVOLTAGE CONTROL

(71) Applicant: Panasonic Intellectual Property Management Co., Ltd., Osaka (JP)

(72) Inventors: Masashi Hayashi, Osaka (JP); Masao Uchida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/413,203

(22) PCT Filed: Feb. 10, 2014

(86) PCT No.: PCT/JP2014/000699
§ 371 (c)(1),
(2) Date: Jan. 6, 2015

(87) PCT Pub. No.: WO2014/192198
PCT Pub. Date: Dec. 4, 2014

(65) Prior Publication Data
US 2015/0206967 A1    Jul. 23, 2015

(30) Foreign Application Priority Data

May 29, 2013    (JP) ................................. 2013-113014

(51) Int. Cl.
*H01L 29/78*    (2006.01)
*H01L 29/739*    (2006.01)
(Continued)

(52) U.S. Cl.
CPC ........ *H01L 29/7815* (2013.01); *H01L 27/0255* (2013.01); *H01L 27/0296* (2013.01);
(Continued)

(58) Field of Classification Search
None
See application file for complete search history.

(56) References Cited

U.S. PATENT DOCUMENTS 7,709,890 B2 *   5/2010   Yoshimura .................... 257/330
8,350,322 B2 *   1/2013   Matsuoka ..................... 257/330
(Continued)

FOREIGN PATENT DOCUMENTS

JP    04-003966 A    1/1992
JP    05-183114 A    7/1993
(Continued)

OTHER PUBLICATIONS

International Search Report issued in PCT/JP2014/000699, dated May 20, 2014, with English translation.

*Primary Examiner* — Joseph Schoenholtz
(74) *Attorney, Agent, or Firm* — McDermott Will & Emery LLP

(57) ABSTRACT

A semiconductor device includes a silicon carbide semiconductor substrate, a silicon carbide layer, a switching element section, and an overvoltage detection element section whose area is smaller than that of the switching element section. The switching element section includes a first electrode pad, a first terminal section surrounding the first electrode pad and provided in the silicon carbide layer, and a first insulating film covering the first terminal section. The overvoltage detection element section includes a second electrode pad, a second terminal section surrounding the second electrode pad and provided in the silicon carbide layer, and a second insulating film covering the second terminal section and being in contact with the silicon carbide layer. A breakdown field strength of at least part of a portion of the second insulating film being in contact with the silicon carbide layer is lower than that of the first insulating film.

9 Claims, 8 Drawing Sheets

(51) Int. Cl.
- *H01L 29/06* (2006.01)
- *H01L 29/12* (2006.01)
- *H01L 27/02* (2006.01)
- *H01L 27/07* (2006.01)
- *H01L 29/16* (2006.01)

(52) U.S. Cl.
CPC ............ *H01L27/0727* (2013.01); *H01L 29/06* (2013.01); *H01L 29/0607* (2013.01); *H01L 29/12* (2013.01); *H01L 29/1608* (2013.01); *H01L 29/7395* (2013.01); *H01L 29/78* (2013.01); *H01L 29/7804* (2013.01)

(56) References Cited

U.S. PATENT DOCUMENTS

| | | | |
|---|---|---|---|
| 8,969,960 B2 * | 3/2015 | Furukawa et al. | 257/341 |
| 9,041,051 B2 * | 5/2015 | Chen et al. | 257/139 |
| 2008/0230810 A1 | 9/2008 | Yoshimura | |
| 2011/0220917 A1 * | 9/2011 | Hayashi et al. | 257/77 |
| 2014/0145260 A1 * | 5/2014 | Matsuura et al. | 257/334 |
| 2015/0001579 A1 * | 1/2015 | Nishimura | 257/140 |
| 2015/0187906 A1 * | 7/2015 | Yoshimochi | 257/140 |

FOREIGN PATENT DOCUMENTS

| | | |
|---|---|---|
| JP | 06-310726 A | 11/1994 |
| JP | 2008-235788 A | 10/2008 |
| JP | 2009-111320 A | 5/2009 |
| JP | 2010-263032 A | 11/2010 |
| WO | 2013-042406 A1 | 3/2013 |

* cited by examiner

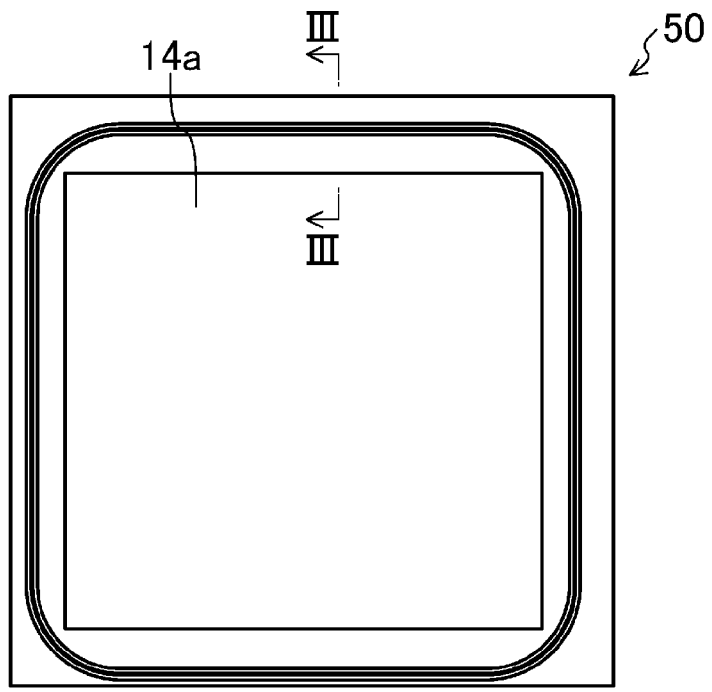
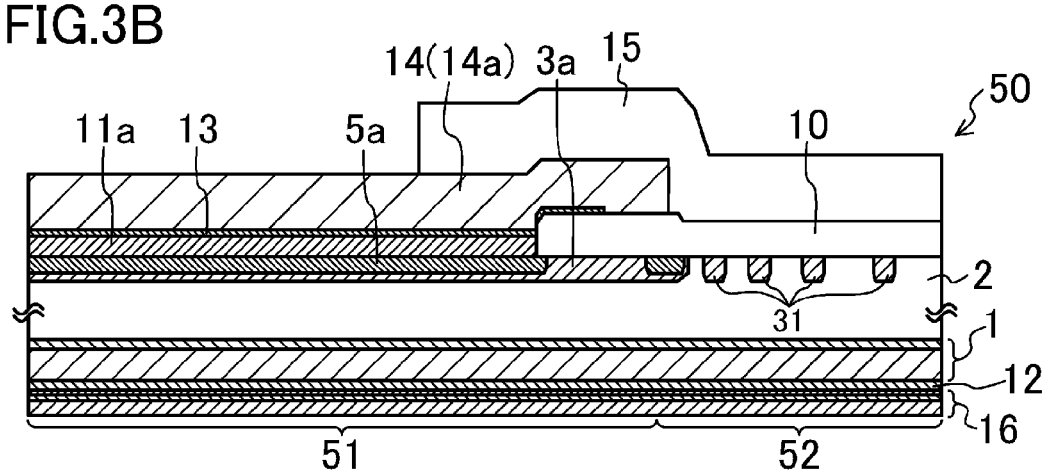
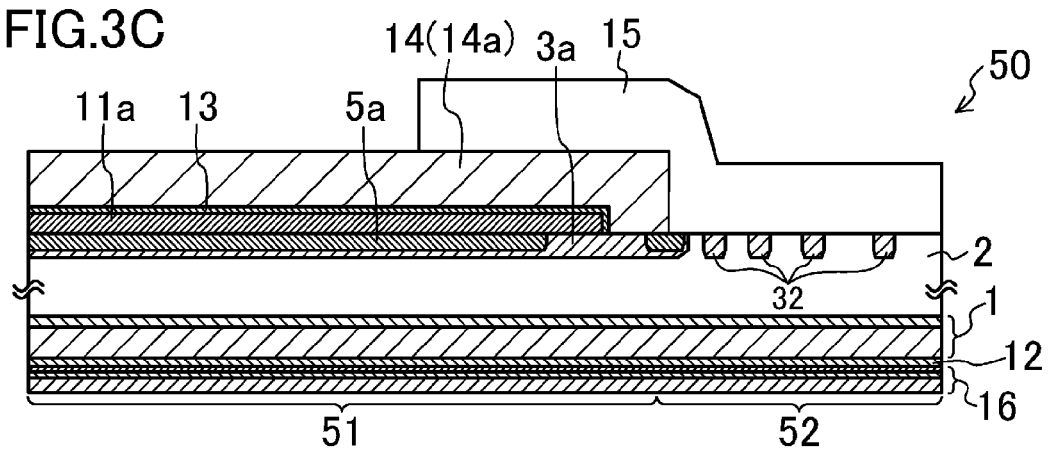

SILICON CARBIDE SWITCHING DEVICE WITH NOVEL OVERVOLTAGE DETECTION ELEMENT FOR OVERVOLTAGE CONTROL

RELATED APPLICATIONS

This application is the U.S. National Phase under 35 U.S.C. §371 of International Application No. PCT/JP2014/000699, filed on Feb. 10, 2014, which in turn claims the benefit of Japanese Application No. 2013-113014, filed on May 29, 2013, the disclosures of which Applications are incorporated by reference herein.

TECHNICAL FIELD

The present disclosure relates to semiconductor devices, in particular to a power semiconductor device including silicon carbide and being capable of withstanding a high voltage and a large current.

BACKGROUND ART

Conventionally, semiconductor devices including a silicon (Si) substrate have been mainly used. In recent years, however, particularly in the field of power semiconductor devices, attention has been focused on semiconductor materials of a hexagonal system such as silicon carbide (SiC) and gallium nitride (GaN), and development of semiconductor devices including these semiconductor materials has been promoted.

A power semiconductor device is a semiconductor element designed for use under application of a high voltage and a large current, and is required to have low losses. In this regard, silicon carbide (SiC) itself has a breakdown voltage which is higher by one digit than that of silicon (Si). Therefore, with the use of SiC, it is possible to maintain a reverse breakdown voltage even when a depletion layer in a pn junction or a Schottky junction has a small thickness. Thus, the use of SiC enables a reduction of the thickness of a device and an increase in a doping concentration. Therefore, SiC is expected to be used as a material for power semiconductor devices which have low on-resistance and low losses and withstand a high voltage.

In addition, intelligent power devices, inclusive of the conventional Si power semiconductor devices, which have a protective function against overcurrent and overvoltage have recently been brought into active use.

Patent Document 1 describes that a configuration in which a transistor to be protected and a pn junction diode whose withstand voltage is sufficiently low are provided on a single substrate enables accurate control of the breakdown voltage and reduction of the total area of the chip. Patent Document 2 relating to a metal-oxide-semiconductor field effect transistor (MOSFET) having a trench structure also describes a structure to increase the breakdown voltage of an oxide film on the trench bottom and to ensure the reliability for a long time. According to Patent Document 2, after forming a mesa region near the trench MOSFET, a pn junction diode made of n-type polysilicon and p-type polysilicon is formed, thereby making the withstand voltage of the pn junction diode lower than that of the trench MOSFET.

Further, Patent Document 3 describes that, in order to provide protection against overvoltage, a switching element and a pn junction-type avalanche diode of which the curvature of pn junction and the withstand voltage are lower than those of the switching element are formed on a single substrate. According to Patent Document 3, the gate potential of the switching element can be controlled based on detection results of an avalanche current of the protective diode.

CITATION LIST

Patent Document

PATENT DOCUMENT 1: Japanese Unexamined Patent Publication No. H06-310726
PATENT DOCUMENT 2: Japanese Unexamined Patent Publication No. 2009-111320
PATENT DOCUMENT 3: Japanese Unexamined Patent Publication No. H05-183114

SUMMARY OF THE INVENTION

Technical Problem

The configurations of the diodes protective against overvoltage described in Patent Documents 1 and 2 enable protection of the switching element to be protected, but do not make it possible to control the gate potential after detecting an overvoltage. The configuration of the avalanche diode protective against overvoltage described in Patent Document 3 cannot always detect an overvoltage caused by an instantaneous change in voltage because the avalanche diode exhibits reversible breakdown voltage characteristics in response to an overvoltage. Thus, safe control of the switching element may be affected.

In view of the foregoing, an object of the present disclosure is to provide a semiconductor device which includes a switching element and can surely detect an overvoltage so as to cause the switching element to stop switching operation upon occurrence of the overvoltage.

Solution to the Problem

To achieve the object, the present disclosure provides a semiconductor device including: a silicon carbide semiconductor substrate; a silicon carbide layer on a principal surface of the silicon carbide semiconductor substrate; a switching element section including a portion of the silicon carbide semiconductor substrate and a portion of the silicon carbide layer; and an overvoltage detection element section including another portion of the silicon carbide semiconductor substrate and another portion of the silicon carbide layer, wherein an area of the principal surface of the silicon carbide semiconductor substrate included in the overvoltage detection element section is smaller than an area of the principal surface of the silicon carbide semiconductor substrate included in the switching element section, the switching element section includes a first electrode pad provided above the silicon carbide layer, a first terminal section surrounding the first electrode pad and provided in the silicon carbide layer, and a first insulating film covering the first terminal section and being in contact with the silicon carbide layer, the overvoltage detection element section includes a second electrode pad provided above the silicon carbide layer, a second terminal section surrounding the second electrode pad and provided in the silicon carbide layer, and a second insulating film covering the second terminal section and being in contact with the silicon carbide layer, and a breakdown field strength of at least part of a portion of the second insulating film being in contact with the silicon carbide layer is lower than that of the first insulating film.

Advantages of the Invention

According to the present disclosure, the semiconductor device including the switching element can surely detect an overvoltage so as to cause the switching element to stop switching operation upon occurrence of the overvoltage.

BRIEF DESCRIPTION OF THE DRAWINGS

FIG. 3A is a plan view illustrating a configuration of each of two pn junction diodes prototyped in order to examine the configuration of the semiconductor device of the present disclosure. FIGS. 3B and 3C are cross-sectional views of the two prototyped pn junction diodes, taken along the line III-III in FIG. 3A.

DESCRIPTION OF EMBODIMENTS

First, an instantaneous potential change which occurs in drain-source potential (Vds) of a conventional vertical double diffused MOSFET (DMOSFET) when the DMOSFET is rapidly switched (turned off) is described.

Figure 7:
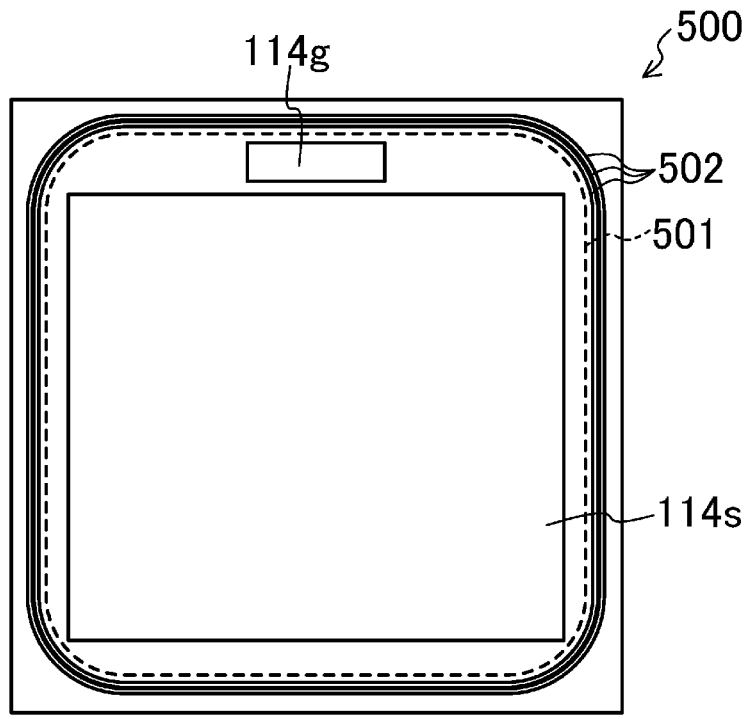
FIG. 7 is a plan view schematically illustrating a configuration of a conventional semiconductor device having a vertical DMOSFET structure.

FIG. 7 is a plan view illustrating a conventional semiconductor device 500 having a vertical DMOSFET structure formed on a silicon carbide substrate. As illustrated in FIG. 7, the semiconductor device 500 includes a DMOSFET region 501 and a terminal guard ring region 502 for ensuring a breakdown voltage. In the DMOSFET region 501, a gate electrode pad 114g electrically connected to a gate terminal of the DMOSFET and a source electrode pad 114s electrically connected to a source terminal of the DMOSFET are provided.

Further, a drain electrode (not shown) is provided on a surface of the silicon carbide substrate opposite to a surface thereof on which the gate electrode pad 114g and the source electrode pad 114s are provided.

Figure 8:
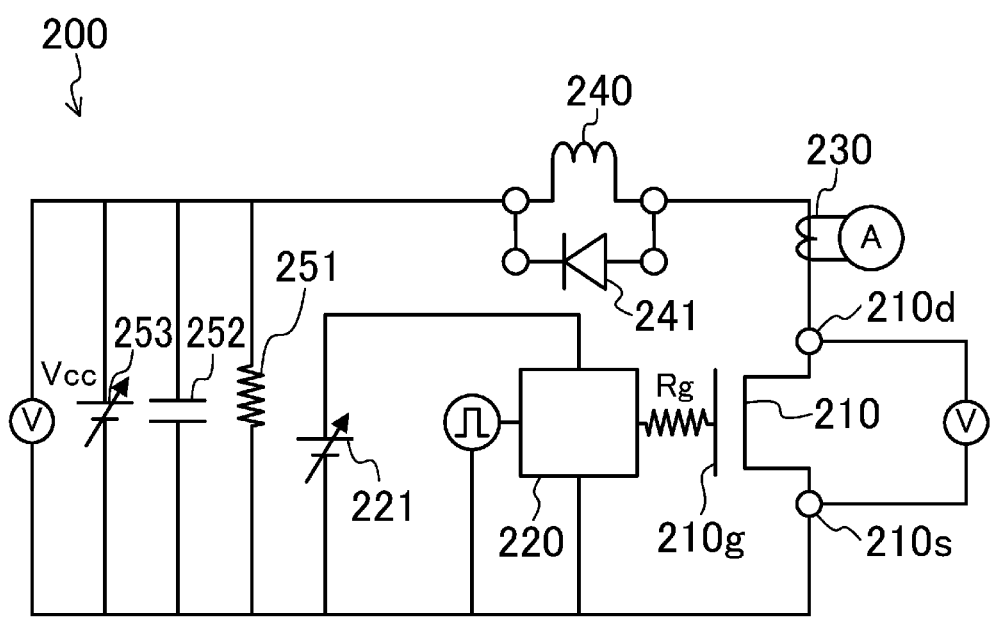
FIG. 8 illustrates a switching evaluation circuit configured to evaluate the switching characteristics of a switching element connected to an inductor load.

FIG. 8 illustrates a general switching evaluation circuit 200 configured to evaluate the switching characteristics of a switching element connected to an inductor load (load L=1 mH). A device 210 including a source 210s, a drain 210d, and a gate 210g is connected to the switching evaluation circuit 200. The gate 210g is connected to an external gate resistor Rg. A gate driver 220 and a gate driver power source 221 drive the device 210. A shunt resistor 230 and the inductor load 240 are sequentially connected to the drain 210d of the device 210. A diode 241 is connected in parallel to the inductor load 240. In addition, the switching evaluation circuit 200 includes a discharging resistor 251, a capacitor 252, and a variable power source 253 which are connected in parallel to one another. Further, the switching evaluation circuit 200 is equipped with an ammeter, a voltmeter, and the like, thereby measuring a current, a voltage, etc. as necessary.

With this circuit configuration, it is possible to observe an overshoot which occurs in the drain-source voltage Vds when the device 210 is turned off, for example.

Figure 9A:
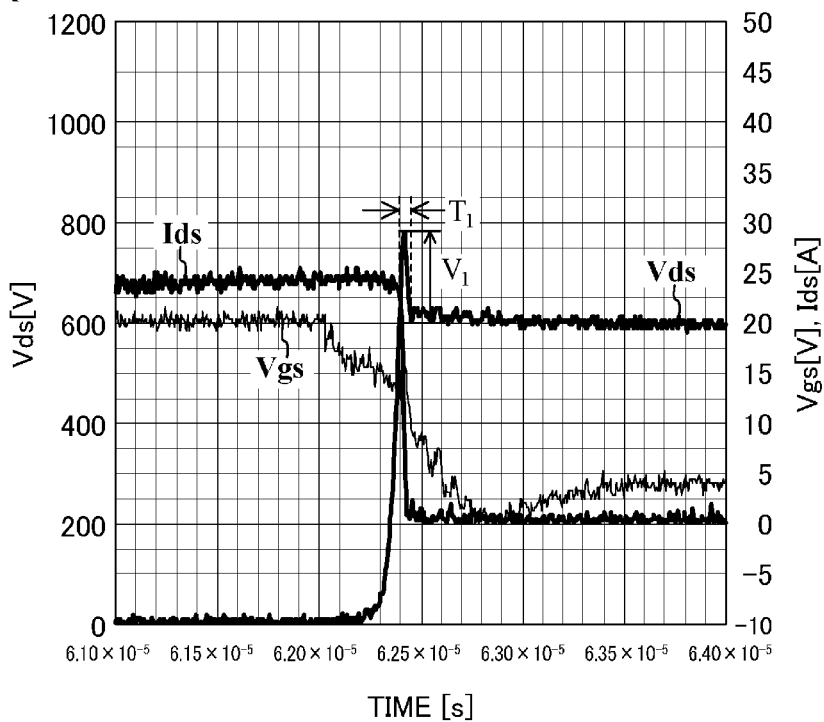
FIG. 9A illustrates switching waveforms observed when a device connected to an external gate resistor (Rg) set to 47 Ω is turned off.
Figure 9B:
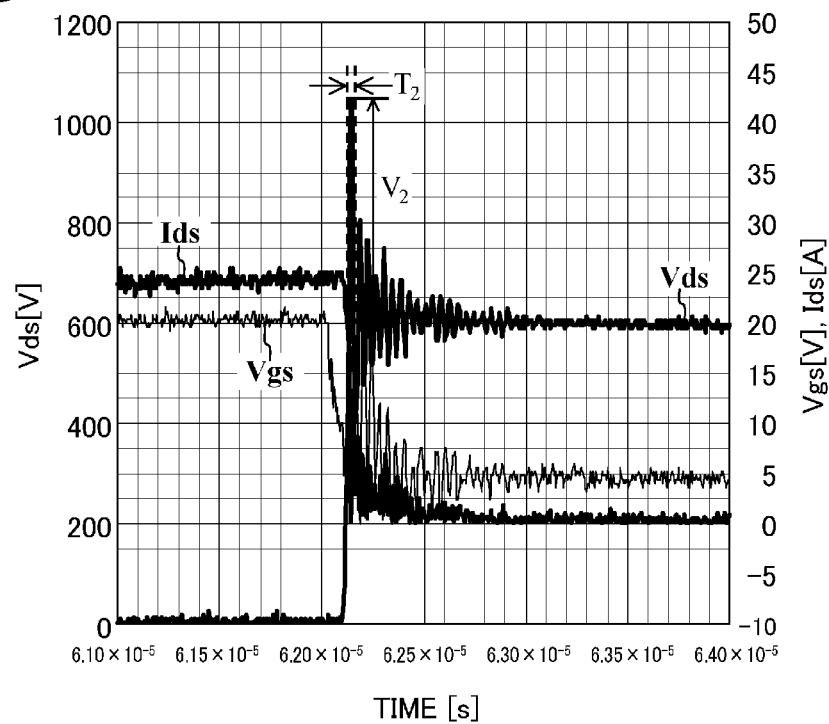
FIG. 9B illustrates switching waveforms observed when the device connected to the external gate resistor (Rg) set to 3 Ω is turned off.

FIGS. 9A and 9B each illustrate switching waveforms observed when the device is turned off. The external gate resistor (Rg) in FIG. 9A was set to 47 Ω, and the external gate resistor (Rg) in FIG. 9B was set to 3 Ω. The measurements were conducted with a power supply voltage Vcc set to 600 V and a drain current Ids set to 25 A.

As illustrated in FIGS. 9A and 9B, when the semiconductor device 500 is turned off, an overshoot occurred in the drain-source voltage Vds of the semiconductor device 500. When the external gate resistor Rg was 47 Ω (FIG. 9A), the overshoot voltage $V_1$ of the drain-source voltage Vds was about 181 V and the overshoot time $T_1$ was about 60 ns. On the other hand, with the external gate resistor Rg set to 3 Ω (FIG. 9B), the switching time was short when the semiconductor device was turned off, and thus, the value of dVds/dt increased. Consequently, the overshoot voltage $V_2$ was about 466 V and the overshoot time $T_2$ was about 35 ns. That is, in the case illustrated in FIG. 9B, a higher overvoltage was applied to the semiconductor device 500 within a shorter time than in the case illustrated in FIG. 9A.

In the measurements, no breakage of the semiconductor device 500 was caused by application of the instantaneous overvoltage due to the occurrence of the overshoots. However, repeated application of such an overvoltage to an element may cause breakage of the element. In view of this, there is a demand that SiC power semiconductor devices which are expected to be used for high-speed switching have a function of surely detecting an instantaneous overvoltage as well.

To satisfy this demand, the present disclosure provides a semiconductor device including: a silicon carbide semiconductor substrate; a silicon carbide layer on a principal surface of the silicon carbide semiconductor substrate; a switching element section including a portion of the silicon carbide semiconductor substrate and a portion of the silicon carbide layer; and an overvoltage detection element section including another portion of the silicon carbide semiconductor substrate and another portion of the silicon carbide layer, wherein an area of the principal surface of the silicon carbide semiconductor substrate included in the overvoltage detection element section is smaller than an area of the principal surface of the silicon carbide semiconductor substrate included in the switching element section, the switching element section includes a first electrode pad extending above the silicon carbide layer, a first terminal section surrounding the first electrode pad and extending in the silicon carbide layer, and a first insulating film covering the first terminal section and being in contact with the silicon carbide layer, the overvoltage detection element section includes a second electrode pad extending above the silicon carbide layer, a second terminal section surrounding the second electrode pad and extending in the silicon carbide layer, and a second insulating film covering the second terminal section and being in contact with the silicon carbide layer, and at least part of a portion of the second insulating film being in contact with the silicon carbide layer has a breakdown field strength lower than that of the first insulating film.

When an overvoltage is applied to the semiconductor device thus configured, an electrical breakdown occurs preferentially in at least part of a second insulating film located in the second terminal section. By utilizing this feature, the overvoltage can be detected by the overvoltage detection element section. Since an electrical breakdown occurring in an insulating film is irreversible, even an instantaneous overvoltage can be surely detected.

At this time, the electrical breakdown brings the overvoltage detection element section into conduction, and consequently, a current passes through the overvoltage detection element section. However, the area of the principal surface of the silicon carbide semiconductor substrate included in the overvoltage detection element section is smaller than the area of the principal surface of the silicon carbide semiconductor substrate included in the switching element section, and consequently, the value of the current passing through the overvoltage detection element section due to the occurrence of the electrical breakdown is smaller than the value of a current which can pass upon occurrence of an electrical breakdown in the switching element section. Thus, with the use of the overvoltage detection element section, it is possible to detect an overvoltage at a smaller current than in a case where the switching element section is used.

When an overvoltage is detected by the overvoltage detection element section, an off signal is input to the switching element, thereby causing the switching element to stop operating. It is thus possible to protect the switching element included in the semiconductor device against overvoltages applied to the semiconductor device.

Here, examples of an instantaneous overvoltage include a voltage overshoot occurring when the switching element section which is used to drive an inductive load is turned off.

In the semiconductor device of the present disclosure, a material forming the first insulating film may differ from a material forming the at least part of the portion of the second insulating film being in contact with the silicon carbide layer.

The configuration in which at least part of the portion of the second insulating film being in contact with the silicon carbide layer is made of the material having a breakdown field strength lower than that of the material forming the first insulating film can cause the at least part of the portion of the second insulating film being in contact with the silicon carbide layer to have a breakdown field strength lower than that of the first insulating film.

In the semiconductor device of the present disclosure, the silicon carbide layer may contain an impurity of a first conductivity type, and each of the first and second terminal sections may include a plurality of impurity regions of a second conductivity type extending in the silicon carbide layer.

In the semiconductor device of the present disclosure, the first insulating film may be a silicon oxide film, and the at least part of the portion of the second insulating film being in contact with the silicon carbide layer may be a silicon nitride film.

The semiconductor device of the present disclosure may be configured such that the switching element section further includes a gate insulating film extending over the silicon carbide layer, a gate electrode located on the gate insulating film, and an interlayer insulating film electrically insulating the first electrode pad from the gate electrode, the switching element section and the overvoltage detection element section further include a passivation film extending on a portion of the first electrode pad and a portion of the second electrode pad, the first insulating film is the gate insulating film, and the second insulating film is the passivation film.

The semiconductor device of the present disclosure may be configured such that the semiconductor device is in a substantially square shape, as viewed in a direction perpendicular to the principal surface of the silicon carbide semiconductor substrate, the switching element section is in a substantially square shape with rounded corners, as viewed in the direction perpendicular to the principal surface of the silicon carbide semiconductor substrate, and the overvoltage detection element section occupies at least part of a region between one of the rounded corners of the switching element section and a corner of the semiconductor device which is nearest to the one of the rounded corners.

In the configuration in which the switching element section has a square shape with rounded corners as viewed from above, the region between one of the rounded corners of the switching element section and the nearest one of the corners of the semiconductor device is larger than in a case where the corners of the switching element section are not rounded. Accordingly, the overvoltage detection element section is provided to occupy at least part of this region, thereby reducing the increase in the area of the semiconductor device.

The semiconductor device of the present disclosure may be configured such that in the switching element section, a metal-insulator-semiconductor field effect transistor or an insulated gate bipolar transistor is provided in a region surrounded by the first terminal section, and in the overvoltage detection element section, a pn junction diode is provided in a region surrounded by the second terminal section.

With this configuration, since a pn junction diode has less terminals than a transistor, the area of the overvoltage detection element section can be smaller than in a case where the overvoltage detection element section includes a transistor. In addition, since the leak current of a pn junction diode is smaller than that of a Schottky barrier diode, this configuration enables detection of an overvoltage at a smaller current than in a case where the overvoltage detection element section includes a Schottky barrier diode.

In the semiconductor device of the present disclosure, the breakdown field strength of the first insulating film may be equal to or greater than 8.5 MV/cm, and the breakdown field strength of the at least part of the portion of the second insulating film being in contact with the silicon carbide layer may be less than 8.5 MV/cm.

The semiconductor device of the present disclosure may be configured such that the area of the principal surface of the silicon carbide semiconductor substrate included in the overvoltage detection element section is equal to or smaller than 1/1000 of the area of the principal surface of the silicon carbide semiconductor substrate included in the switching element section.

An embodiment of the present disclosure will be described below with reference to the attached drawings. In the attached drawings, components having substantially the same function may be denoted by the same reference character. It should be noted that the present invention is not limited to the embodiment described below.

Figure 1A:
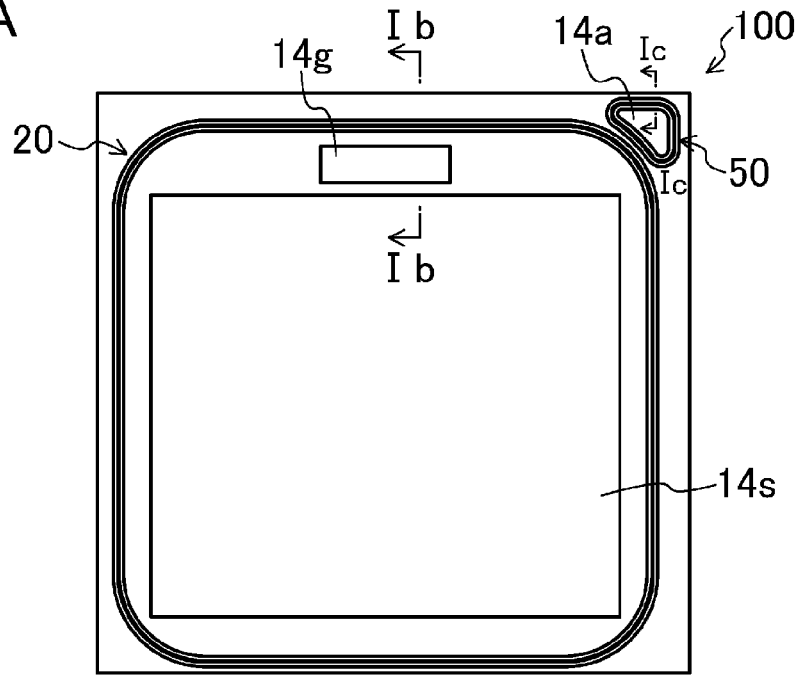
FIG. 1A is a plan view schematically illustrating a configuration of a semiconductor device according to an embodiment of the present disclosure.

FIG. 1A is a schematic plan view of an illustrative semiconductor device 100 according to the embodiment of the present disclosure.

As illustrated in FIG. 1A, the semiconductor device 100 includes a switching element section 20 and an overvoltage detection element section 50 which are provided on a single silicon carbide (SiC) semiconductor substrate. In this embodiment, DMOSFETs are used as the switching element section 20. Insulated gate bipolar transistors may be used as the switching element section 20. In this embodiment, a pn junction diode (PND) is used as the overvoltage detection element section 50.

As viewed from above, the semiconductor device 100 of this embodiment is in a quadrilateral shape. The switching element section 20 is provided with a gate electrode pad 14g and a source electrode pad 14s which are respectively in electrical connection with gate terminals and source terminals of the elements. The overvoltage detection element section 50 is provided with an anode electrode pad 14a which is in electrical connection with an anode terminal of the element. The source electrode pad 14s corresponds to a first electrode pad of the semiconductor device of the present disclosure. The anode electrode pad 14a corresponds to a second electrode pad of the semiconductor device of the present disclosure.

The switching element section 20 of this embodiment is in a substantially square shape with rounded corners, as viewed in the direction perpendicular to the principal surface of the silicon carbide semiconductor substrate. This shape can reduce concentration of electric field in the corner portions. This shape also produces vacant spaces located outside the rounded corners of the switching element section 20 and on the substrate of the semiconductor device 100. Locating the overvoltage detection element section 50 on one of the vacant spaces allows the semiconductor device to include the overvoltage detection element section 50 without increasing the area of the substrate. Thus, the switching element section 20 in the above-described shape is effective at reducing the size of the semiconductor device.

Figure 1B:
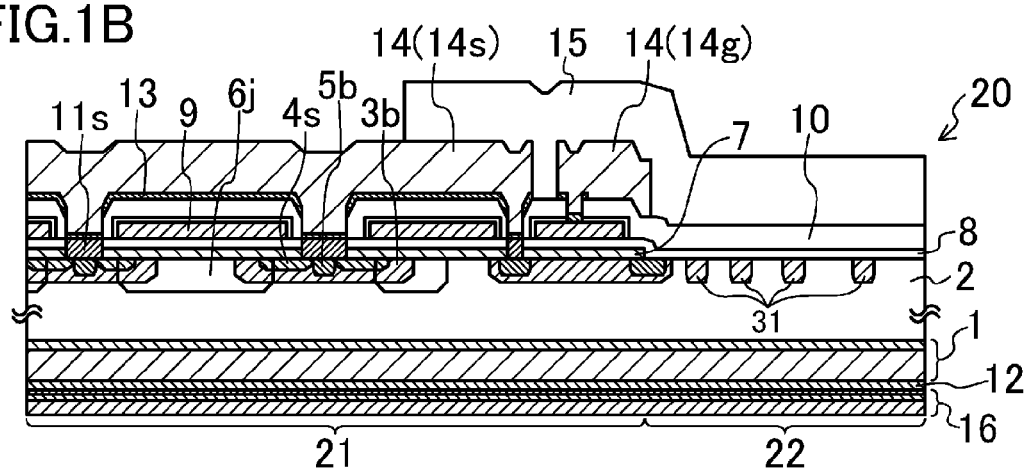
FIG. 1B schematically illustrates a cross section taken along the line Ib-Ib in FIG. 1A.
Figure 1C:
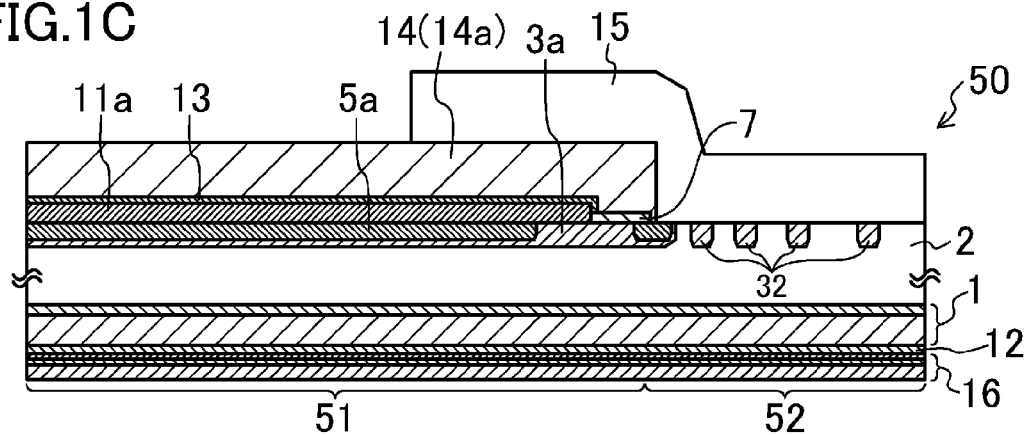
FIG. 1C schematically illustrates a cross section taken along the line Ic-Ic in FIG. 1A.

FIG. 1B is a cross-sectional view taken along the line Ib-Ib in FIG. 1A, and thus, illustrates a cross section of part of the switching element section 20. FIG. 1C is a cross-sectional view taken along the line Ic-Ic in FIG. 1A, and thus, illustrates a cross section of part of the overvoltage detection element section 50.

As illustrated in FIGS. 1B and 1C, the semiconductor device 100 includes the SiC semiconductor substrate 1 of a first conductivity type and a silicon carbide layer 2 of the first conductivity type which is disposed on the principal surface of the SiC semiconductor substrate 1 and has a dopant concentration lower than that of the SiC semiconductor substrate 1. It is illustrated that the SiC semiconductor substrate 1 has a two-layer structure which consists of the substrate and a buffer layer disposed on the substrate. In this specification, the substrate and the buffer layer are collectively referred to as the SiC semiconductor substrate 1. Both the substrate and the buffer layer are of n-type. The substrate has an impurity concentration higher than that of the buffer layer. Further, the impurity concentration of the buffer layer is higher than that of the silicon carbide layer 2.

The first conductivity type of this embodiment corresponds to, for example, the n-type conductivity. The SiC semiconductor substrate 1 of this embodiment is made of hexagonal silicon carbide, for example. The SiC semiconductor substrate 1 has a thickness of 100-350 μm, for example. The n-type impurity concentration of the SiC semiconductor substrate 1 is $8 \times 10^{18}$ cm$^{-3}$, for example.

The silicon carbide layer 2 is a layer epitaxially grown on the principal surface of the SiC semiconductor substrate 1. For example, the silicon carbide layer 2 has a thickness of 5-50 μm and an impurity concentration ranging from $1 \times 10^{15}$ cm$^{-3}$ to $2 \times 10^{17}$ cm$^{-3}$.

Further, as illustrated in FIG. 1B, the switching element section 20 includes a DMOSFET region 21 and a terminal guard ring region 22 surrounding the DMOSFET region 21. The terminal guard ring region 22 corresponds to a first terminal section of the semiconductor device of the present disclosure.

In the DMOSFET region 21, body regions 3b containing a low concentration of a p-type impurity are provided in an upper portion of the n-type silicon carbide layer 2. In an upper portion of each body region 3b, source regions 4s containing a high concentration of an n-type impurity and a body contact region 5b containing a high concentration of a p-type impurity are provided.

Further, in the upper portion of the n-type silicon carbide layer 2, JFET regions 6j are provided. Each JFET region 6j overlaps part of corresponding ones of the body regions 3b and part of corresponding ones of the source regions 4s, and contains a low concentration of an n-type impurity.

In addition, source electrodes 11s each extend continuously on corresponding ones of the source regions 4s and the body contact regions 5b. Each source electrode 11s is a front-surface ohmic electrode made of a compound of nickel or titanium, silicon, and carbon.

A channel layer 7 extend on the surfaces of the n-type silicon carbide layer 2, the body regions 3b, and the source regions 4s. The channel layer 7 is an epitaxial layer made of SiC and containing an n-type impurity. Portions of the channel layer 7 which are in contact with the upper surfaces of the body regions 3b function as channel regions.

Gate electrodes 9 are provided above the channel layer 7 with a gate insulating film 8 interposed therebetween. The gate electrodes 9 are made of polysilicon doped with an n-type impurity such as phosphorus and formed by chemical vapor deposition (CVD) process, for example.

The channel layer 7 does not extend in the terminal guard ring region 22 whereas the gate insulating film 8 extends also in the terminal guard ring region 22.

Furthermore, an interlayer insulating film 10 extends over the gate electrodes 9 and the gate insulating film 8. The interlayer insulating film 10 has openings located above the source electrodes 11s. Above the interlayer insulating film 10, the source electrode pad 14s and the gate electrode pad 14g which are electrode pads 14 extend, and a barrier metal layer 13 is interposed between the interlayer insulating film 10 and the electrode pads 14. The barrier metal layer 13 extends also on the source electrodes 11s, and is a single-layer film or a multilayer film made of at least one of titanium, tantalum, titanium nitride, or tantalum nitride. The electrode pads 14 are made of any one of aluminum, silicon, titanium, and copper, or an alloy of some of them. The source electrode pad 14s is in electrical connection with the source electrodes 11s through the contact holes formed in the interlayer insulating film 10.

In the terminal guard ring region 22, a plurality of field limited rings (FLRs) 31 which are semiconductor rings containing a low concentration of an n-type impurity extend in the n-type silicon carbide layer 2. On the FLRs 31, the gate insulating film 8 on which the interlayer insulating film 10 is disposed extends.

A passivation film 15 made of a silicon oxide or a silicon nitride extends on portions of the electrode pads 14 and a portion of the interlayer insulating film 10 located in the terminal guard ring region 22. A portion of the gate insulating film 8 located in the terminal guard ring region 22 corresponds to a first insulating film of the semiconductor device of the present disclosure.

An insulating film made of an organic coating material may be provided on the passivation film 15. Examples of the organic coating material include polyimide, silicone, etc.

On the back surface of the n-type SiC semiconductor substrate 1, i.e., on the surface opposite to the surface on which the silicon carbide layer 2 extends, a back-surface ohmic electrode 12 which is a drain electrode made of a compound of nickel or titanium, silicon, and carbon is provided. On the back-surface ohmic electrode 12, a back-surface electrode 16 which is a layer made of any one of titanium, nickel, gold, platinum, etc. or a multilayer film made of any two or more of the forgoing substances is provided. The back-surface electrode 16 is in electrical connection with the back-surface ohmic electrode 12.

As illustrated in FIG. 1C, the overvoltage detection element section 50 includes a diode region 51 and a terminal guard ring region 52. The terminal guard ring region 52 corresponds to a second terminal section of the semiconductor device of the present disclosure.

In the diode region 51, an anode region 3a containing a low concentration of a p-type impurity and an anode contact region 5a containing a high concentration of a p-type impurity are provided in an upper portion of the n-type silicon carbide layer 2. The anode region 3a and the anode contact region 5a are formed concurrently with the body regions 3b and the body contact regions 5b, respectively, of the DMOSFET region 21.

In the terminal guard ring region 52, FLRs 32 containing a low concentration of a p-type impurity extend, in a manner similar to that of the FLRs 31 in the terminal guard ring region 22 of the switching element section 20. The FLRs 31 differ from the FLRs 32 in perimeter, as the semiconductor device 100 is viewed from above. The FLRs 31 and the FLRs 32 may have the same structure or different structures.

On the anode contact region 5a, an anode electrode 11a is provided. The anode electrode pad 14a extends above the anode electrode 11a with the barrier metal layer 13 interposed therebetween. The anode electrode 11a, the barrier metal layer 13, and the anode electrode pad 14a may be the same, in material and structure, as the source electrodes 11s, the barrier metal layer 13, and the source electrode pad 14s of the switching element section 20, respectively.

In the example illustrated in FIG. 1C, in a portion of the diode region 51 located near the terminal guard ring region 52, the channel layer 7 extends without being covered with the anode contact region 5a and the anode electrode 11a. This structure, however, is not essential.

The passivation film 15 made of a silicon nitride extends on a portion of the anode electrode pad 14a and a portion of the silicon carbide layer 2 located in the terminal guard ring region 52. The terminal guard ring region 52 may have the structure illustrated in FIG. 1C in the entire periphery of the overvoltage detection element section 50 or only in part of the overvoltage detection element section 50. The portion of the passivation film 15 located in the terminal guard ring region 52 corresponds to a second insulating film of the semiconductor device of the present disclosure.

An insulating film made of an organic coating material may be provided on the passivation film 15. Examples of the organic coating material include polyimide, silicone, etc.

The structure of the back surface of the SiC semiconductor substrate 1 in the overvoltage detection element section 50 is the same as the structure of the back surface in the switching element sections 20. Specifically, the back-surface ohmic electrode 12 functioning as a cathode electrode and the back surface electrode 16 electrically connected to the back-surface ohmic electrode 12 are disposed on the back surface in the overvoltage detection element section 50.

Figure 2:
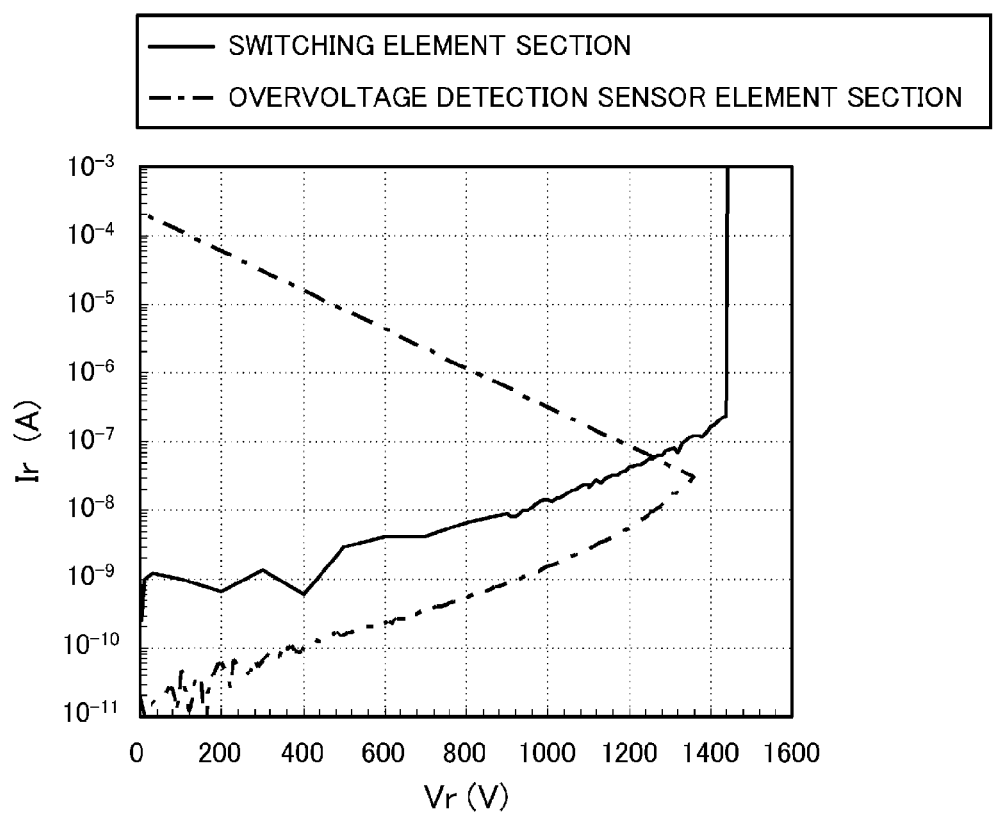
FIG. 2 is a graph showing an example of reverse I-V characteristics of each of a DMOSFET of a switching element section and a pn junction diode of an overvoltage detection element section of the semiconductor device according to an embodiment of the present disclosure.

FIG. 2 shows an example of reverse I-V characteristics of each of the DMOSFETs of the switching element section 20 and the pn junction diode of the overvoltage detection element section 50 of the semiconductor device 100 illustrated in FIGS. 1A-1C.

Here, the area ratio between the DMOSFETs and the pn junction diode is set to 2500:1. The interlayer insulating film 10 located in the terminal guard ring region 22 of the switching element section 20 is a silicon oxide film formed by plasma CVD with the use of tetraethoxysilane (TEOS) (hereinafter abbreviated as the TEOS film). The passivation film 15 is a silicon nitride film formed by plasma CVD. The interlayer insulating film 10 has a thickness of about 1 μm, and the passivation film 15 has a thickness of about 1.6 μm. A portion of the passivation film 15 located in the terminal guard ring region 52 of the overvoltage detection element section 50 has the same structure as that of a portion of the passivation film 15 located in the terminal guard ring region 22 of the switching element section 20.

It has been found that the DMOSFETs have a breakdown voltage of about 1450 V and the pn junction diode has a breakdown voltage of about 1350 V. Thus, the withstand voltage of the DMOSFETs of the switching element section 20 is higher by about 100 V than that of the pn junction diode of the overvoltage detection element section 50. Accordingly, the semiconductor device 100 is used with the source electrode pad 14s and the anode electrode pad 14a electrically connected to each other and the switching element section 20 and the overvoltage detection element section 50 connected in parallel to each other. With this configuration, an overvoltage exceeding the breakdown voltage of the pn junction diode of the overvoltage detection element section 50 causes an electrical breakdown in the pn junction diode of the overvoltage detection element section 50. It is accordingly possible to detect an overvoltage by sensing that the value of a current passing through the pn junction diode of the overvoltage detection element section 50 has exceeded a predetermined value.

Further, since the pn junction diode is designed to have a sufficiently small area as compared to the DMOSFETs, a leak current which flows from the pn junction diode of the overvoltage detection element section 50 immediately before occurrence of an electric breakdown is smaller by approximately one digit than a leak current which may flow from the DMOSFETs of the switching element section 20 immediately before occurrence of an electric breakdown. Accordingly, the pn junction diode of the overvoltage detection element section 50 can detect an electrical breakdown at a smaller current than the DMOSFETs of the switching element section 20. Consequently, with the use of the overvoltage detection element section 50, an overvoltage can be detected at a smaller current than in a case where the switching element section 20 is used for the detection of an overvoltage.

As shown in FIG. 2, the switching element section 20 has such I-V characteristics that the leak current continues to increase after the breakdown voltage is reached. On the other hand, the overvoltage detection element section 50 has such I-V characteristics that the voltage decreases after the breakdown voltage is exceeded.

This is because a reversible breakdown occurs in the switching element section 20 whereas an irreversible breakdown occurs in the portion of the passivation film 15 located in the terminal guard ring region 52 of the overvoltage detection element section 50.

As a result, the breakdown field strength of the portion of the passivation film 15 in the terminal guard ring region 52 of the overvoltage detection element section 50 is presumed to be about 8.5 MV/cm. It has also been found that a voltage which is higher by about 100 V than the breakdown voltage of the portion of the passivation film 15 in the terminal guard ring region 52 causes no electrical breakdown in the layered structure located in the terminal guard ring region 22 of the switching element section 20 and including the gate insulating film 8, the interlayer insulating film 10, and the passivation film 15.

Thus, the reverse I-V characteristics of the overvoltage detection element section 50 is irreversibly changed by an electrical breakdown in the passivation film 15. Accordingly, an instantaneous overvoltage occurring in the semiconductor device 100 can be surely detected as well.

Next, in order to examine the pn junction diode of the overvoltage detection element section 50 of the semiconductor device 100, a pn junction diode having the interlayer insulating film 10 and a pn junction diode having no interlayer insulating film 10 were prototyped and their reverse J-V characteristics were evaluated.

FIG. 3A illustrates the prototyped pn junction diodes as viewed from above. FIGS. 3B and 3C are cross-sectional views taken along the line III-III in FIG. 3A. FIGS. 3B and 3C illustrate the pn junction diode having the interlayer insulating film 10 and the pn junction diode having no interlayer insulating film 10, respectively.

The structure including the pn junction diode illustrated in FIG. 3C is the same as the overvoltage detection element section 50 illustrated in FIG. 1C except that the diode illustrated in FIG. 3C does not include the channel layer 7. The structure illustrated in FIG. 3B includes, in addition to the components of the structure of FIG. 3C, the interlayer insulating film 10 extending on the silicon carbide layer 2 and under the passivation film 15. In both structures, the interlayer insulating film 10 and the passivation film 15 are a TEOS film (with a thickness of about 1 μm) and a silicon nitride film (with a thickness of about 1.6μm), respectively. The chip size of each of the pn junction diodes is 0.5 mm square.

Figure 4:
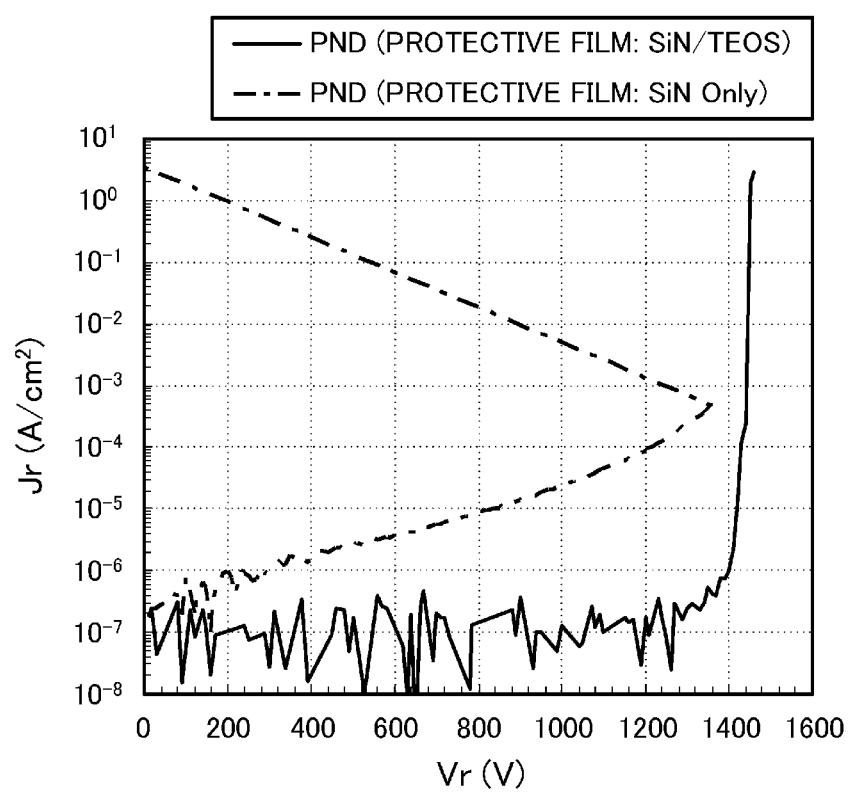
FIG. 4 shows examples of the reverse J-V characteristics of prototyped pn junction diodes of which passivation films on terminal guard ring regions are made of different materials.

FIG. 4 shows an example of the results of evaluation of the reverse J-V characteristics of the pn junction diodes illustrated in FIGS. 3A-3C. The vertical axis represents a leak current density (Jr) which is standardized based on the effective area of the diode region 51.

As shown in FIG. 4, a comparison of the standardized leak current densities shows that the leak current density of the structure of FIG. 3C including no interlayer insulating film 10 (TEOS film) is higher than that of the structure of FIG. 3B including the interlayer insulating film 10. In particular, in the high voltage zone of 1000 V or more, the leak current density of the structure of FIG. 3C is higher than that of structure of FIG. 3B by two or more digits.

This shows the following. In the semiconductor device 100 of this embodiment illustrated in FIGS. 1A-1C, it is possible to allow a leak current which passes upon occurrence of an electrical breakdown in the overvoltage detection element section 50 to be smaller than a leak current which passes upon occurrence of an electrical breakdown in the switching element section 20, by designing the overvoltage detection element section 50 to have an area corresponding to about 1/1000 or less of the area of the switching element section 20. In this embodiment, the area of the overvoltage detection element section 50 is 1/2500 of the area of the switching element section 20.

In this embodiment, the presence or absence of the interlayer insulating film 10 causes the insulating films in the terminal guard ring regions 22 and 52 to have different breakdown field strengths. Specifically, the interlayer insulating film 10 serves as the insulating film in the terminal guard ring region 22 of the switching element section 20 whereas the passivation film 15 serves as the insulating film in the terminal guard ring region 52 of the overvoltage detection element section 50. Thus, insulating films made of different materials have different breakdown field strengths.

It is sufficient that at least part of a portion of the insulating film located in the terminal guard ring region 52 of the overvoltage detection element section 50 and being in contact with the silicon carbide layer has a breakdown field strength lower than that of the insulating film in the terminal guard ring region 22 of the switching element section 20.

Specifically, the overvoltage detection element section 50 may have the structure illustrated in FIG. 1C in the portion corresponding to the line Ic-Ic in FIG. 1A, and may include the interlayer insulating film 10 in the terminal guard ring region 52 of the other portions, in a manner similar to that of the structure illustrated in FIG. 1B. This configuration, in which an electrical breakdown of the insulating film occurs in the portion corresponding to the line Ic-Ic, can also provide the advantages of the semiconductor device 100. The entire overvoltage detection element section 50 may be structured as illustrated in FIG. 1C.

For example, the insulating film in the terminal guard ring region 22 of the switching element section 20 has a breakdown field strength equal to or greater than 8.5 MV/cm, and the insulating film in the terminal guard ring region 52 of the overvoltage detection element section 50 may have a breakdown field strength less than 8.5 MV/cm.

It is preferable that the insulating film in the terminal guard ring region 52 of the overvoltage detection element section 50 has a thickness of 1 μm or more, for example.

The semiconductor device 100 is operated at a voltage of about 600 V, for example. An oxide film formed by CVD has a breakdown field strength of about 6-7 MV/cm. Thus, when the operating voltage of a semiconductor device is 600 V and an oxide film formed by CVD process is used as an insulating film, it is preferable that the insulating film has a thickness of 1 μm or more in order to prevent an electrical breakdown from occurring in the insulating film at the operating voltage. When an insulating film of a different type is used and the semiconductor device operates at a different operating voltage, a desirable thickness of the insulating film can also be determined in a similar manner.

Figure 5A:
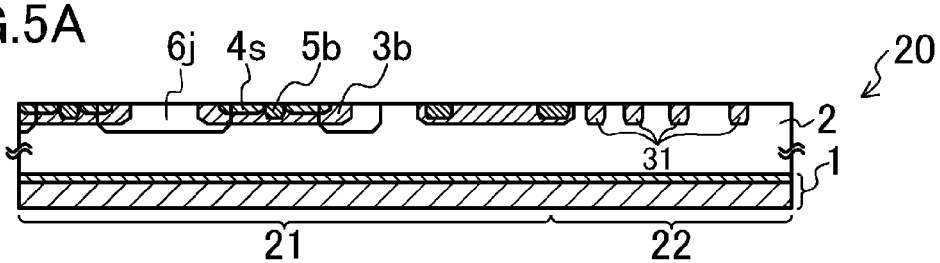
FIGS. 5A-5E illustrate steps of fabricating the switching element section of FIG. 1B.

Next, a method for fabricating the semiconductor device 100 is described with reference to FIGS. 5A-5E and FIGS. 6A-6E. FIGS. 5A-5E illustrate fabrication steps of the switching element section 20 of FIG. 1B. FIGS. 6A-6E illustrate fabrication steps of the overvoltage detection element section 50 of FIG. 1C. In FIGS. 5A-5E and FIGS. 6A-6E, the figures marked with the same alphabet letter illustrate a single step. For example, FIGS. 5A and 6A illustrate the same step.

First, an n-type 4H-SiC (0001) substrate is prepared as a SiC semiconductor substrate 1. For example, this substrate is off-cut at an angle of 8° or 4° in the <11-20> direction, and has an n-type impurity concentration ranging from about $1\times10^{18}$ $cm^{-3}$ to about $5\times10^{19}$ $cm^{-3}$.

Next, as illustrated in FIGS. 5A and 6A, an n-type silicon carbide layer 2 is epitaxially grown on the principal surface of the SiC semiconductor substrate 1. Specifically, in this step, the silicon carbide layer having a thickness of 5-50 μm and a dopant concentration ranging from about $1\times10^{15}$ $cm^{-3}$ to about $2\times10^{17}$ $cm^{-3}$ is formed by thermal CVD with the use of hydrogen ($H_2$) as a carrier gas, nitrogen ($N_2$) as a dopant gas, silane ($SiH_4$).

Next, in a switching element section 20, body regions 3b and FLRs 31 containing a low concentration of a p-type impurity, source regions 4s containing a high concentration of an n-type impurity, body contact regions 5b containing a high concentration of a p-type impurity, and JFET regions 6j containing a low concentration of an n-type impurity are formed in the silicon carbide layer 2. In an overvoltage detection element section 50, an anode region 3a and FLRs 32 containing a low concentration of a p-type impurity, and an anode contact region 5a containing a high concentration of an n-type impurity are formed in the silicon carbide layer 2. Specifically, a mask defining the regions is formed on the silicon carbide layer 2. Thereafter, nitrogen ions or phosphorus ions as the n-type impurity, and aluminum ions or boron ions as the p-type impurity are implanted into the silicon carbide layer 2. For example, a mask made of a silicon oxide may be used as the mask for this ion implantation. In this manner, the impurity regions each having a predetermined depth are formed in a surface portion of the silicon carbide layer 2. For example, this ion implantation is performed with an implantation energy of 30-700 keV at once or in two or more steps. The temperature of the substrate is from room temperature to 500° C. The depth of each impurity region is 0.1-1 µm, for example.

Next, the SiC semiconductor substrate 1 on or in which the layer and regions have been formed is subjected to activation annealing at a temperature equal to or higher than 1000° C., specifically at about 1700° C. in this embodiment, thereby activating the implanted impurities.

Figure 5B:
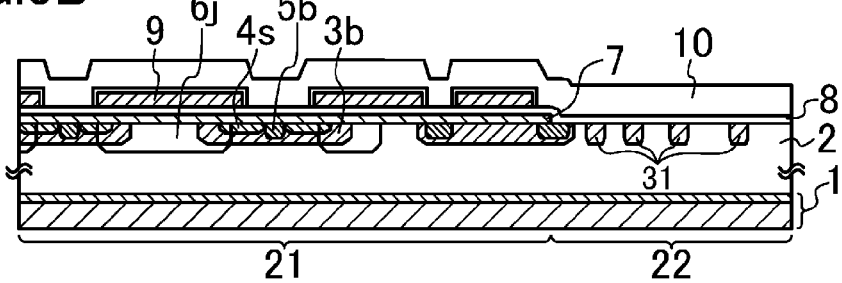
Figure 6A:
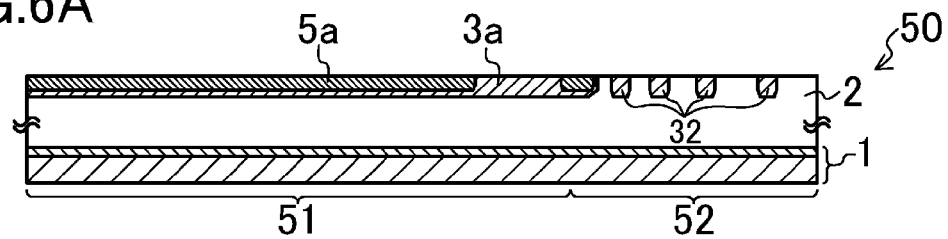
FIGS. 6A-6E illustrate steps of fabricating the overvoltage detection element section of FIG. 1C.
Figure 6B:
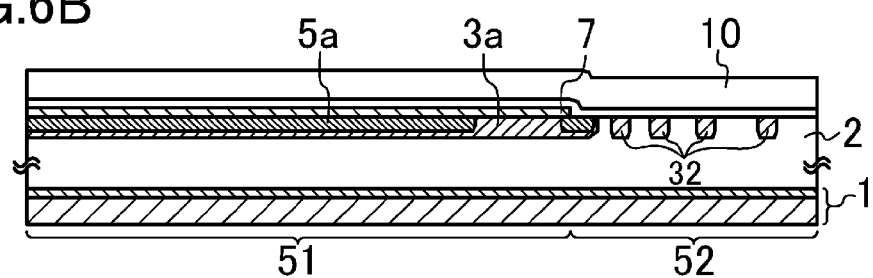

Next, as illustrated in FIGS. 5B and 6B, a channel layer 7 is formed on a portion of the silicon carbide layer 2 located in the DMOSFET region 21 and on a portion of the silicon carbide layer 2 located in the diode region 51. The formation of the channel layer 7 is carried out with the use of hydrogen ($H_2$) as a carrier gas, nitrogen ($N_2$) as a dopant gas, silane ($SiH_4$) and propane ($C_3H_8$) as material gases.

Further, the surface of the silicon carbide layer 2 is subjected to, e.g., thermal oxidation, thereby forming a gate insulating film 8 which is a silicon oxide film. Specifically, the SiC semiconductor substrate 1 on which the forgoing layers have been formed is placed in a quartz pipe, and then oxygen is introduced into the quartz pipe at a flow rate of 2.5 l/min while the temperature in the quartz pipe is maintained at 1180° C. Thus, the thermal oxidation film having a thickness of about 60 nm is formed to extend over the SiC semiconductor substrate 1 and the channel layer 7 extending over the substrate 1.

Next, a poly-Si film having a thickness of about 500 nm is formed by low pressure CVD. Subsequently, portions of the poly-Si film corresponding to the contact holes and their surroundings are removed by, e.g., reactive ion etching (RIE), thereby forming gate electrodes 9. Further, an interlayer insulating film 10 is formed to cover the entire surface of the SiC semiconductor substrate 1. For example, the interlayer insulating film 10 is a silicon oxide film deposited by CVD and has a thickness of 0.5-1 µm.

Figure 5C:
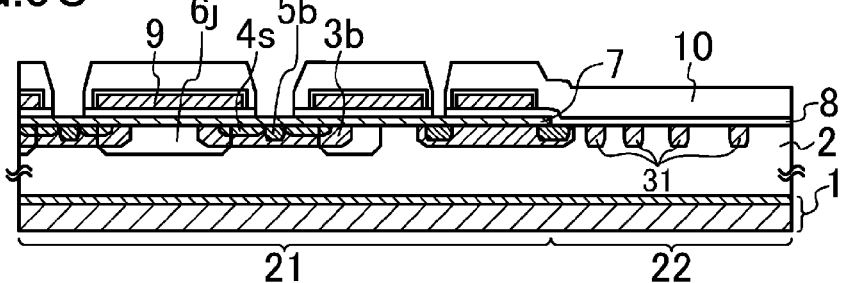
Figure 6C:
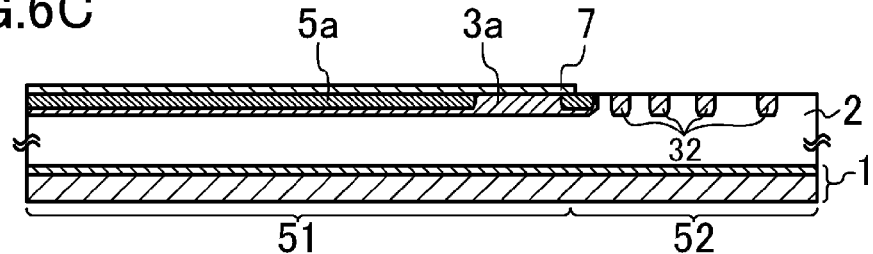

Next, as illustrated in FIGS. 5C and 6C, contact holes which penetrate the interlayer insulating film 10 and expose portions of the channel layer 7 are formed by RIE, for example. At the same time, as illustrated in FIG. 6C, a portion of the interlayer insulating film 10 located in the overvoltage detection element section 50 is entirely or partially removed.

Figure 5D:
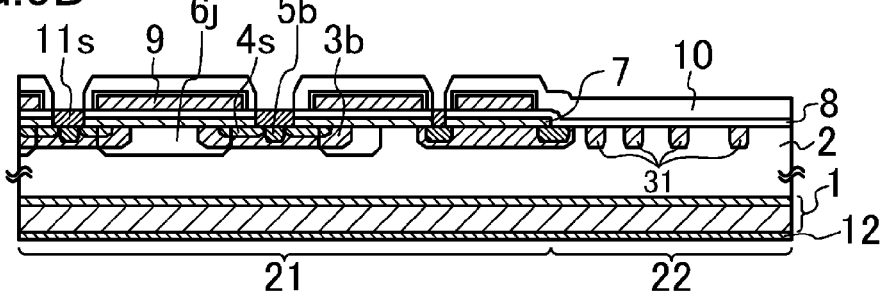
Figure 6D:
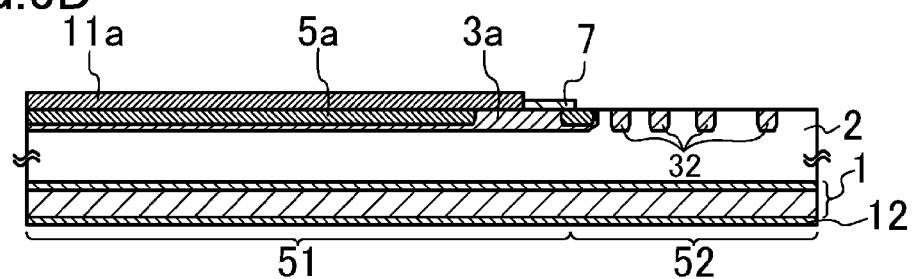

Subsequently, the step illustrated in FIGS. 5D and 6D is performed. First, a film of, e.g., nickel or titanium is deposited, by electron beam (EB) deposition, sputtering, or the like, on the portions of the channel layer 7 having been exposed through the step illustrated in FIGS. 5C and 6C. It is preferable to allow the film of, e.g., nickel or titanium to have a thickness of 100 nm or more in order to ensure that front-surface ohmic electrodes 11 each have a thickness of 50 nm or more.

Subsequently, after patterning the deposited film of, e.g., titanium or nickel, a heat treatment is performed in an inert gas such as nitrogen or argon for one minute or more. With this heat treatment, the metals such as titanium and nickel and silicon and carbon included in the channel layer 7 form compounds. Thus, source electrodes 11s which are some of the front-surface ohmic electrodes being in ohmic contact with the source regions 4s and the body contact regions 5b of the DMOSFET region 21 and the anode electrode 11a which is one of the front-surface ohmic electrodes being in ohmic contact with the anode contact region 5a of the diode region 51 are formed. It is preferable to perform the heat treatment at a temperature ranging from 850° C. to 1000° C., to cause a silicide reaction to occur in nickel or titanium and to avoid deformation of the interlayer insulating film 10 and deterioration of the material forming the interlayer insulating film 10.

Further, at the same time as or after the formation of the electrodes 11s and 11a, a back-surface ohmic electrode 12 made of a compound of nickel or titanium, silicon and carbon is formed on the back surface of the SiC semiconductor substrate 1 in a manner similar to that of the front-surface ohmic electrodes. In the switching element section 20, the back-surface ohmic electrode 12 functions as a drain electrode. In the overvoltage detection element section 50, the back-surface ohmic electrode 12 functions as a cathode electrode. The drain electrode and the cathode electrode are in electrical connection with each other on the same principal surface.

Figure 5E:
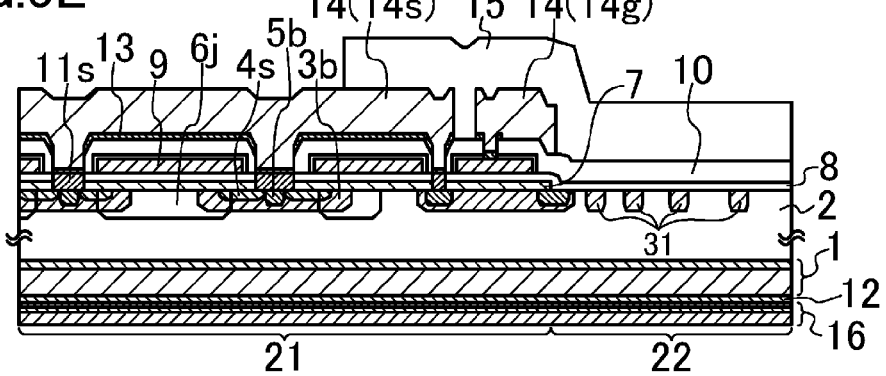
Figure 6E:
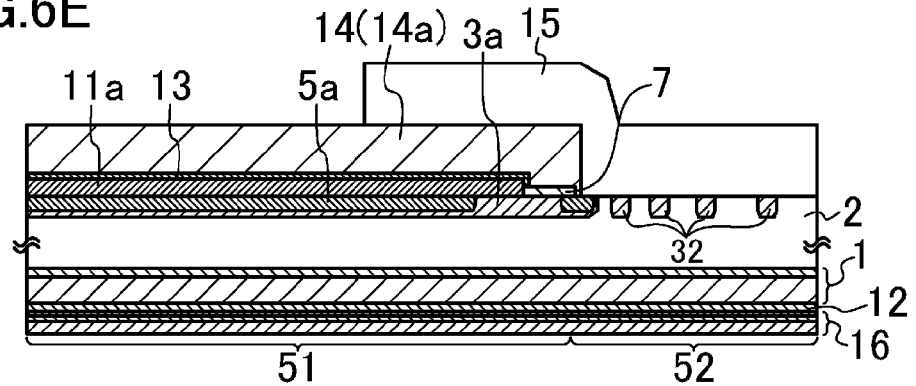

Next, the step illustrated in FIGS. 5E and 6E is performed. On the interlayer insulating film 10 and the source electrode 11s of the switching element section 20 and on the anode electrode 11a of the overvoltage detection element section 50, a barrier metal layer 13 having a thickness of about 50-100 nm and the electrode pads 14 having a thickness of 3 µm or more are formed. The formation of the barrier metal layer 13 and the electrode pads 14 is implemented by deposition such as EB deposition or sputtering and patterning by ordinary photolithography and etching.

The barrier metal layer 13 is a single layer film made of titanium, tantalum, titanium nitride, or tantalum nitride, or a multilayer film made of two or more of the forgoing substances. The electrode pads 14 are made of any one of aluminum, silicon, titanium, or copper, or alternatively, made of an alloy containing two or more of these metals.

Furthermore, a passivation film 15 is formed above the front surface of the SiC semiconductor substrate 1 and a back-surface electrode 16 is formed over the back surface of the SiC semiconductor substrate 1.

The passivation film 15 is, e.g., an oxide or nitride film of Si deposited by CVD and has a thickness of 1-3 µm. After forming the passivation film 15, a mask defining the source electrode pad 14s of the switching element section 20 and the anode electrode pad 14a of the overvoltage detection element section 50 is formed, and then, the source electrode pad 14s and the anode electrode pad 14a are exposed by RIE with the use of the mask, for example. As illustrated in FIG. 6E, the passivation film 15 is in direct contact with a portion of the silicon carbide layer 2 located in the terminal guard ring region 52.

The back surface electrode 16 is a single-layer film or a multilayer film made of, e.g., titanium, nickel, silver, gold, or platinum. The back surface electrode 16 is formed by EB deposition or sputtering, for example. The back surface electrode 16 has a thickness of 1-3 µm, for example.

As described above, the semiconductor device 100 including differently structured insulating films in the terminal guard ring region 22 of the switching element section 20 and the terminal guard ring region 52 of the overvoltage detection element section 50 is fabricated through the simple steps. Specifically, in the step illustrated in FIGS. SC and 6C, the contact holes are formed in the switching element section 20, and the interlayer insulating film 10 is removed from the overvoltage detection element section 50 at the same time. This provides the semiconductor device 100 including the differently structured insulating films in the terminal guard ring region 22 and the terminal guard ring region 52. Thus, the semiconductor device 100 of this embodiment can be fabricated without increasing the number of fabrication steps and the fabrication costs.

INDUSTRIAL APPLICABILITY

The semiconductor device of the present disclosure is useful for, e.g., semiconductor power devices for use in power converters installed in vehicles and industrial equipment.

DESCRIPTION OF REFERENCE CHARACTERS

1 SiC semiconductor substrate
2 Silicon carbide layer
3a Anode region
3b Body region
4s Source region
5a Anode contact region
5b Body contact region
6j JFET region
7 Channel layer
8 Gate insulating film
9 Gate electrode
10 Interlayer insulating film
11a Anode electrode
11s Source electrode
12 Back-surface ohmic electrode
13 Barrier metal layer
14 Electrode pads
14a Anode electrode pad
14g, 114g Gate electrode pad
14s, 114s Source electrode pad
15 Passivation film
16 Back-surface electrode
20 Switching element section
21, 501 DMOSFET region
22, 52, 502 Terminal guard ring region
31, 32 Field limited ring (FLR)
50 Overvoltage detection element section
51 Diode region
100, 500 Semiconductor device
200 Switching evaluation circuit
210 Device
210g Gate
210d Drain
210s Source
220 Gate driver
221 Gate driver power source
230 Shunt resistor
240 Inductor load
241 Diode
251 Discharging resistor
252 Capacitor
253 Variable power source

The invention claimed is:
1. A semiconductor device comprising:
a silicon carbide semiconductor substrate;
a silicon carbide layer on a principal surface of the silicon carbide semiconductor substrate;
a switching element section including a portion of the silicon carbide semiconductor substrate and a portion of the silicon carbide layer; and
an overvoltage detection element section including another portion of the silicon carbide semiconductor substrate and another portion of the silicon carbide layer, wherein
an area of the principal surface of the silicon carbide semiconductor substrate included in the overvoltage detection element section is smaller than an area of the principal surface of the silicon carbide semiconductor substrate included in the switching element section,
the switching element section includes a first electrode pad provided above the silicon carbide layer, a first terminal section surrounding the first electrode pad and provided in the silicon carbide layer, and a first insulating film covering the first terminal section and being in contact with the silicon carbide layer,
the overvoltage detection element section includes a second electrode pad provided above the silicon carbide layer, a second terminal section surrounding the second electrode pad and provided in the silicon carbide layer, and a second insulating film covering the second terminal section and being in contact with the silicon carbide layer, and
a breakdown field strength of at least part of a portion of the second insulating film being in contact with the silicon carbide layer is lower than that of the first insulating film.
2. The semiconductor device of claim 1, wherein
a material forming the first insulating film differs from a material forming the at least part of the portion of the second insulating film being in contact with the silicon carbide layer.
3. The semiconductor device of claim 1, wherein
the silicon carbide layer contains an impurity of a first conductivity type, and
each of the first and second terminal sections includes a plurality of impurity regions of a second conductivity type provided in the silicon carbide layer.
4. The semiconductor device of claim 1, wherein
the first insulating film is a silicon oxide film, and
the at least part of the portion of the second insulating film being in contact with the silicon carbide layer is a silicon nitride film.
5. The semiconductor device of claim 1, wherein
the switching element section further includes
a gate insulating film provided over the silicon carbide layer,
a gate electrode located on the gate insulating film, and
an interlayer insulating film electrically insulating the first electrode pad from the gate electrode,
the switching element section and the overvoltage detection element section further include a passivation film provided on a portion of the first electrode pad and a portion of the second electrode pad,
the first insulating film is the gate insulating film, and
the second insulating film is the passivation film.
6. The semiconductor device of claim 1, wherein
the semiconductor device is in a substantially square shape, as viewed in a direction perpendicular to the principal surface of the silicon carbide semiconductor substrate,
the switching element section is in a substantially square shape with rounded corners, as viewed in the direction perpendicular to the principal surface of the silicon carbide semiconductor substrate, and the overvoltage detection element section occupies at least part of a region between one of the rounded corners of the switching element section and a corner of the semiconductor device which is nearest to the one of the rounded corners.

7. The semiconductor device of claim 1, wherein in the switching element section, a metal-insulator-semiconductor field effect transistor or an insulated gate bipolar transistor is provided in a region surrounded by the first terminal section, and in the overvoltage detection element section, a pn junction diode is provided in a region surrounded by the second terminal section.

8. The semiconductor device of claim 1, wherein the breakdown field strength of the first insulating film is equal to or greater than 8.5 MV/cm, and the breakdown field strength of the at least part of the portion of the second insulating film being in contact with the silicon carbide layer is less than 8.5 MV/cm.

9. The semiconductor device of claim 1, wherein the area of the principal surface of the silicon carbide semiconductor substrate included in the overvoltage detection element section is equal to or smaller than $1/1000$ of the area of the principal surface of the silicon carbide semiconductor substrate included in the switching element section.

* * * * *